(12) United States Patent
Chen et al.

(10) Patent No.: US 6,852,549 B2
(45) Date of Patent: Feb. 8, 2005

(54) FERROELECTRIC THIN FILM PROCESSING FOR FERROELECTRIC FIELD-EFFECT TRANSISTOR

(75) Inventors: San-Yuan Chen, Hsinchu (TW); Chia-Liang Sun, Yunghe (TW); Albert Chin, Hsinchu (TW)

(73) Assignee: National Chiao Tung University (TW)

( * ) Notice: Subject to any disclaimer, the term of this patent is extended or adjusted under 35 U.S.C. 154(b) by 0 days.

(21) Appl. No.: 10/273,200

(22) Filed: Oct. 17, 2002

(65) Prior Publication Data

US 2003/0224537 A1 Dec. 4, 2003

(30) Foreign Application Priority Data

May 28, 2002 (TW) ........................................ 91111381 A

(51) Int. Cl.[7] .............................................. H01L 21/00
(52) U.S. Cl. ........................... 438/3; 438/396; 438/399; 438/239; 438/240; 438/238; 438/199
(58) Field of Search ............................. 438/3, 679, 256, 438/399, 396, 239, 386, 199, 240, 459, 977, 689, 253, 238, 200

(56) References Cited

U.S. PATENT DOCUMENTS

| 5,736,073 A | * | 4/1998 | Wadley et al. ................ 264/10 |
| 6,531,324 B2 | * | 3/2003 | Hsu et al. ....................... 438/3 |
| 2001/0053740 A1 | * | 12/2001 | Kim ........................... 501/134 |
| 2002/0079588 A1 | * | 6/2002 | Kim et al. ................... 257/774 |
| 2002/0125515 A1 | * | 9/2002 | Joo et al. .................... 257/295 |
| 2003/0008179 A1 | * | 1/2003 | Lee et al. ................... 428/697 |

* cited by examiner

Primary Examiner—Matthew Smith
Assistant Examiner—Igwe U. Anya
(74) Attorney, Agent, or Firm—Webb Ziesenheim Logsdon Orkin & Hanson, P.C.

(57) ABSTRACT

The present invention relates to a method for manufacturing a ferroelectric field-effect transistor, particularly to a ferroelectric field-effect transistor with a metal/ferroelectric/insulator/semiconductor (MFIS) gate capacitor structure. The method comprises steps of depositing a bismuth layered ferroelectric film on the insulator buffered Si, after a high-temperature thermal treatment, depositing an upper electrode on the bismuth layered ferroelectric film.

14 Claims, 6 Drawing Sheets

(a)   (b)

FERROELECTRIC THIN FILM PROCESSING FOR FERROELECTRIC FIELD-EFFECT TRANSISTOR

FIELD OF THE INVENTION

The present invention relates to a method of manufacturing a semiconductor, and more particularly to a transistor with a metal/ferroelectric thin film/insulator/semiconductor (MFIS) gate capacitor structure.

BACKGROUND OF THE INVENTION

The present silicon memory devices can be sorted by the storage state of the data. One type of the silicon memory devices is the random access memory (RAM), such as DRAM and SRAM. This type of memory device with data reading/writing speed below several ten nanoseconds is generally called quick-access memory. However, the data saved therein will disappear while the power is shut down. Therefore, the storage state of the RAM is volatile. Another type is the read only memory (ROM), such as electrical erasable programmable read only memory (EEPROM) and flash memory. On the contrary, this type of memory device can save the data permanently but has longer reading/writing speed than the RAM. Because the data do not disappear while the power is shut down, the storage state of the RAM is nonvolatile.

Although the current memory devices all have high density (>64 Mbit), the important properties, non-volatility and quick speed, cannot be performed at the same time. Since the demand for ferroelectric random access memory (FRAM) consisting these two merits becomes urgent.

The FRAM has the same speed in reading/writing data with the conventional RAM, so it belongs to the quick-access memory. When writing data, the ferroelectric film is polarized permanently by a electrical pulse so that the data written in is saved forever even that the power is shut down. Therefore, the FRAM is a non-volatile memory device with quick and non-disappeared properties. Moreover, the design of ROM+RAM can be replaced by one FRAM and then the efficiency will be promoted greatly.

Principle of non-volatile ferroelectric memory device for application is using the polarization-electric field (P-E) hysteresis of the ferroelectric film. Because the ferroelectric film has remnant polarization while no external electric field exists, the data do not disappear when shutting down the power. In the practical application, the ferroelectric film capacitor replaces the storage capacitor of $SiO_2$ to distinct the logic "0" and "1" by different remnant polarization (Pr). When the logic is "0", adding a positive voltage has a difference between Pr and saturation polarization (Ps). While the logic is "1", the difference is between -Pr and Ps. The current of logic "1" is larger than that of logic "0" so that it is able to be used for determining the data logic.

In the development of the FRAM, how to combine the manufacture process of ferroelectric and silicon integrated circuit is a key point. Especially when the high density memory is developed, the ferroelectric capacitor formed on the gate of the metal oxide semiconductor field-effect transistor (MOSFET) is imperative, so the research in this aspect is extensively noted. In 1950~1960, scientists use the natural polarization of the ferroelectric ceramics to control (or change) the electric conduction coefficient on the surface of the semiconductor for producing the ferroelectric field-effect transistor memory. Recently, owing to the excellent characteristics of the ferroelectric film, and requirements of both high density G-bite DRAM and non-volatile memory devices so that the FRAM is noted and studied once again.

In view of foregoing reasons, the present invention provides the ultra-thin aluminum oxide to be the insulator for solving charge-injection problem and the material with bismuth layered perovskite structure to be the ferroelectric film due to its non-fatigue behavior and compatibility to the other high-temperature semiconductor process so that excellent memory characteristics can be reached in the MFIS stacked gate capacitor structure.

SUMMARY OF THE INVENTION

It is an object of the present invention to provide a production process for manufacturing a bismuth layered ferroelectric film on the ultra-thin aluminum oxide. The single ferroelectric field-effect transistor is produced by the process of the present invention having superior memory property which is due to the ferroelectricity of the ferroelectric film. By appropriately controlling the high-temperature process, the large memory window due to the ferroelectricity and low leakage current are observed in single ferroelectric transistor with a metal/ferroelectric/insulator/Si (MFIS) gate capacitor structure. The low leakage current density matches ULSI device requirement and further the high-temperature process is compatible with CMOS and other post-end semiconductor process.

It is another object of the present invention to provide a method for manufacturing a semiconductor applied to a ferroelectric memory device, including steps of providing an insulator, forming a bismuth ferroelectric film with bismuth layered perovskite structure on the insulator, wherein the bismuth is partially substituted by one of lanthanum and vanadium, treating the insulator and the bismuth ferroelectric thin film at a relatively high temperature, and plating a metal layer on the bismuth ferroelectric film.

Preferably, the insulator is aluminum oxide.

Preferably, the insulator further includes one selected from a group consisting of aluminates, silicides, zirconium oxides, bismuth oxides and a mixture thereof.

Preferably, the insulator is a gate dielectric layer having a relatively high dielectric constant.

Preferably, the insulator is formed by means of sputtering.

Preferably, the insulator is formed by means of metalorganic chemical vapor deposition (MOCVD).

Preferably, the insulator is formed by means of molecular beam epitaxy (MBE).

Preferably, the insulator is formed by means of jet vapor deposition (JVD).

Preferably, the insulator is formed by means of electron beam evaporation and following oxidation process.

Preferably, the bismuth ferroelectric film includes bismuth ion precursors, titanium ion precursors and one of lanthanum ion precursors and vanadium ion precursors.

Preferably, the bismuth ion precursors, titanium ion precursors and one selected from a group consisting of lanthanum ion precursors, vanadium ion precursors and the mixture thereof are at a molar ratio of $(4-X):3:X(Bi^{3+}:Ti^{4+}:La^{3+}/V^{3+})$, wherein $0<X<1.9$.

Preferably, the bismuth layered ferroelectric film is formed by means of spin coating of a chemical solution.

Preferably, the chemical solution is one selected from a group consisting of bismuth acetate, lanthanum acetate, titanium n-butoxide and the mixture thereof dissolving in a mixing solvent of acetic acid and 2-methoxyethanol.

Preferably, the chemical solution includes an metallo-organic precursor and an organic solvent.

Preferably, the metallo-organic precursor is one selected from a group of bismuth, lanthanum and titanium with carbon chains, respectively.

Preferably, the organic solvent is used for dissolving said metallo-organic precursors.

Preferably, the organic solvent includes alcohols and carboxylic acids.

Preferably, the bismuth layered ferroelectric film is formed by means of sputtering.

Preferably, the bismuth layered ferroelectric film is formed by means of pulsed laser deposition (PLD).

Preferably, the bismuth layered ferroelectric film is formed by means of MOCVD.

Preferably, the relatively high temperature is ranged from 600 to 1000° C.

The above objects and advantages of the present invention will become more readily apparent to those ordinarily skilled in the art after reviewing the following detailed description and accompanying drawings, in which:

BRIEF DESCRIPTION OF THE DRAWINGS

FIG. 1($b$) is a schematic diagram of lanthanum substituted bismuth titanate ceramic structure according to the prior art.

DETAILED DESCRIPTION OF THE PREFERRED EMBODIMENT

In order to solve the charge injection problem, aluminum oxide layer is used to be the insulator. For testing the application of ferroelectric material in the present invention, the bismuth layer structured ferroelectric is considered and used as the ferroelectric material which chemical formula can be represented as $(Bi_2O_2)^{2+}(A_{m-1}B_mO_{3m+1})^{2+}$. The present invention takes $Bi_{3.25}La_{0.75}Ti_3O_{12}$ (m=3) for example, $Bi_{3.25}La_{0.75}Ti_3O_{12}$ (BLT) is used to be the material and produce the capacitor having BLT/$Al_2O_3$/Si MFIS structure.

Preparation of Buffer Layer

After dealing silicon substrate cleaned with RCA and treated by hydrofluoric acid vapor, then the metal aluminum is deposited on the surface of the silicon substrate in the electron beam evaporation system to form a metal film with several ten nanometer thereon. After thermal oxidation at 900° C., the aluminum film converts to the aluminum oxide film with thickness below 10 nm.

Preparation of Chemical Solution

Take BLT ($Bi_{4-x}La_xTi_3O_{12}$) for example, dissolving bismuth acetate, lanthanum acetate and titanium n-butoxide in acetic acid and 2-methoxyethanol mixture, the molar ratio of $Bi^{3+}:La^{3+}:Ti^{4+}$ is (4–X):X:3, wherein 0<X<1.9. After the chemical solution is clear, the chemical solution must be stirred at least ten hours to carry out the hydrolysis condensation of the different metallo-organic precursors.

Preparation of Ferroelectric Film

The synthesized chemical solution is spin coated uniformly on the silicon substrate having the insulator thereon by means of rotary plating in 4000 rpm for 30 seconds. After each step of plating gel, the silicon substrate have to remove the organic solvent on hot plate at 400° C. Repeat the above-mentioned steps of coating and drying several times and then raise the temperature to the desired temperature in oxygen atmosphere. Keep the temperature one hour so as to finish the thermal treatment.

Figure 1:
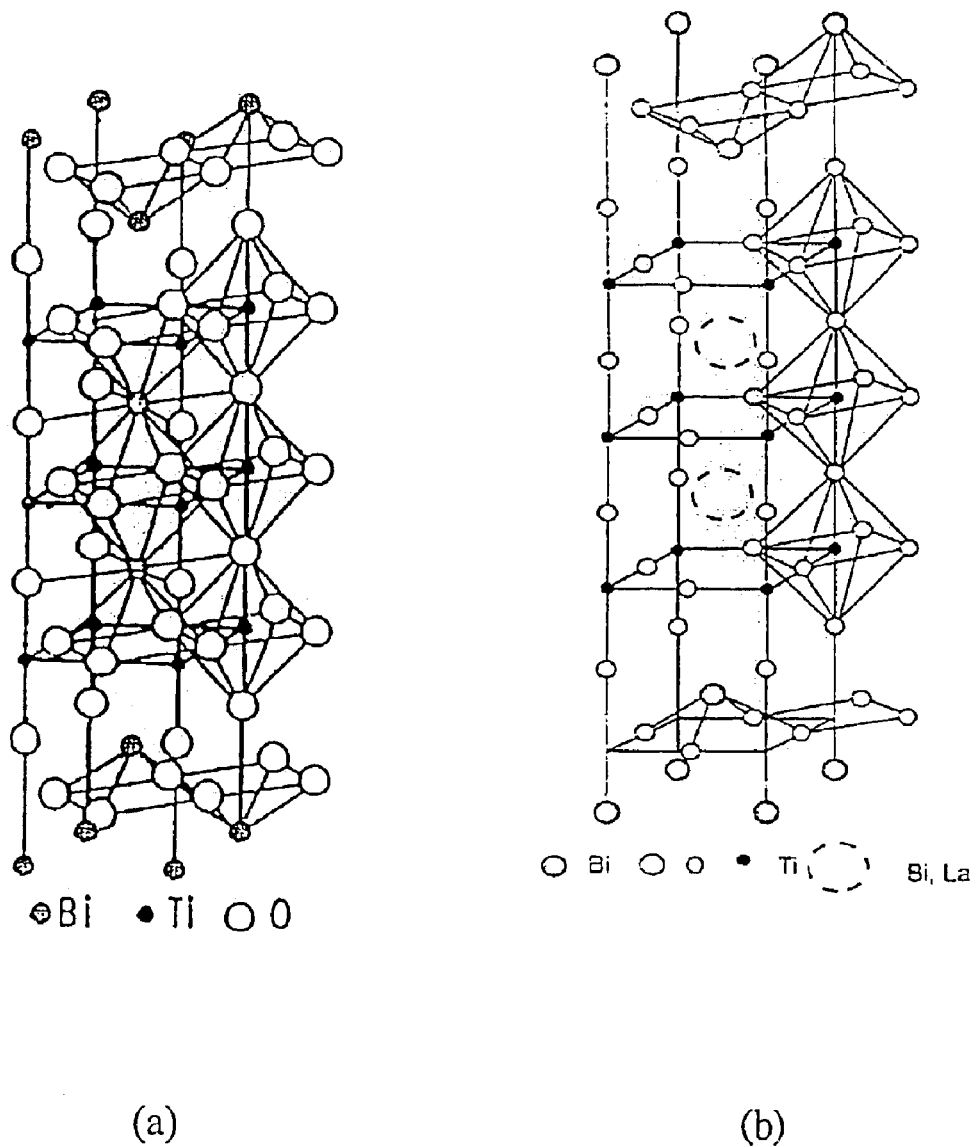
FIG. 1($a$) is a schematic diagram of bismuth titanate ceramic structure according to the prior art.

FIGS. 1($a$) and 1($b$) display the structures of bismuth titanate ceramics ($Bi_4Ti_3O_{12}$) and lanthanum substituted bismuth titanate ceramics ($Bi_{4-x}La_xTi_3O_{12}$), respectively. As shown in FIG. 1($a$), bismuth titanate ceramics have bismuth layered perovskite structure (($Bi_2O_2)^{2+}(A_{m-1}B_mO_{3m+1})^{2+}$). As shown in FIG. 1($b$), according to the prior art, the A-sites in the bismuth layered perovskite structure are occupied by lanthanum. Furthermore, because the stability of the lanthanum substituted bismuth layered perovskite structure is improved and the antiphase boundary is formed easily, the BLT ferroelectric film is non-fatigue on the noble metal electrode.

Figure 2:
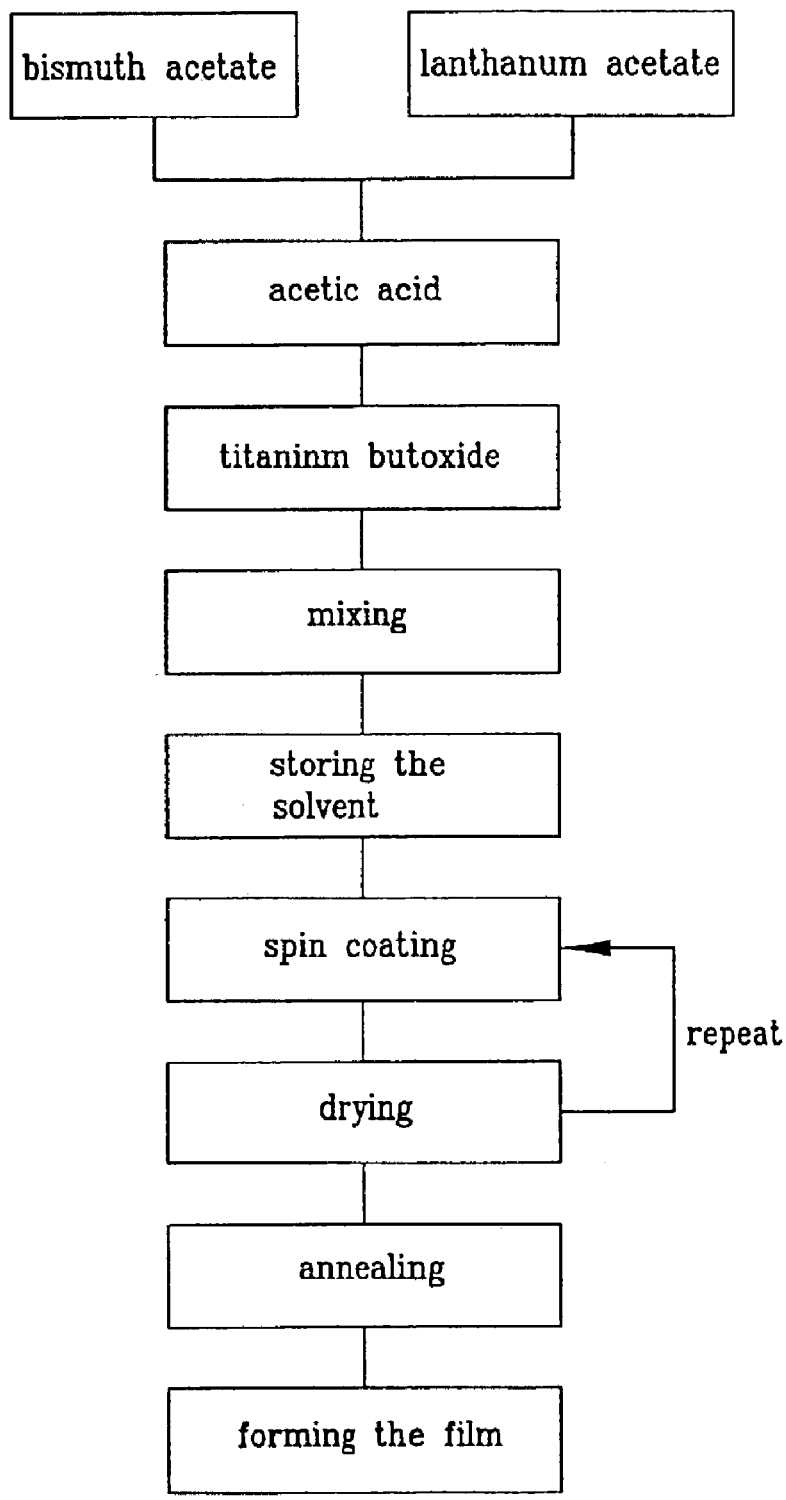
FIG. 2 is a flow chart of forming the lanthanum substituted bismuth titanate ferroelectric film.

FIG. 2 is a flow chart showing how to form the BLT ferroelectric film, wherein the statement is the same with preparation of chemical solution in above section. The precursors capable to synthesize the chemical solution are not only the example mentioned therein but also the bismuth, lanthanum and titanium precursors with various carbon chains. The organic solvents used for dissolving the metallo-organic precursors further includes alcohols, carboxylic acids and other organic solvent. Because the metal bismuth has high vapor pressure and evaporates easily, it is necessary to increase the content about 10%. In addition, the chemical solution can be added various chelating agents, e.g. glycerol, or other solvents to adjust the chemical solvent. The chelating agent can adjust the degree of hydrolysis condensation between molecules in the chemical solution or the bonding state between metal ions and organic molecules around the metal ions. Adding the chelating agent can directly influence crystallization temperature and the grain size of the ferroelectric film. Moreover, the thermal treatment condition can be referred to the results of thermal analysis, and carried out in the different atmosphere, such as NO or $N_2O$, and different temperature during different time period, even by means of rapid thermal annealing (RTA) or other energy resources.

Figure 3:
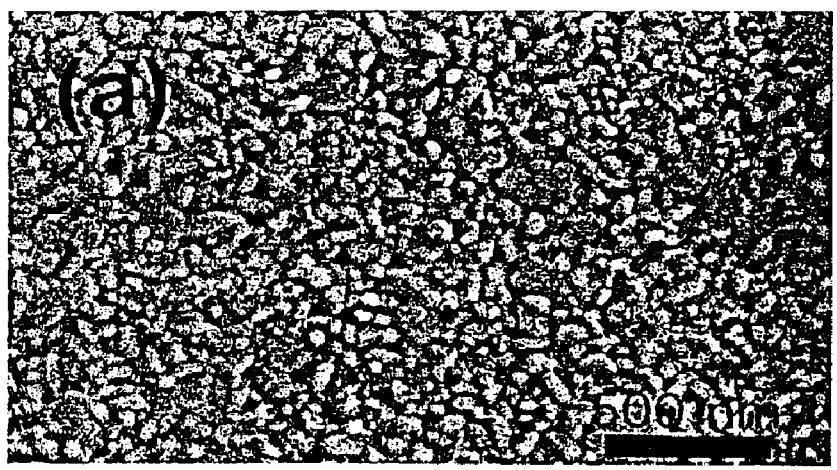
FIG. 3 is a surface image of lanthanum substituted bismuth titanate ceramics after thermal treatment at (a) 700° C. (b) 850° C. (c) 950° C.
Figure 3:
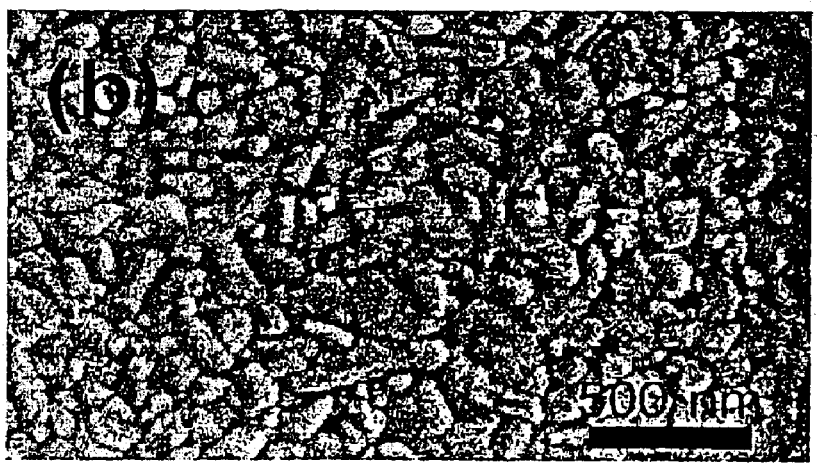
Figure 3:
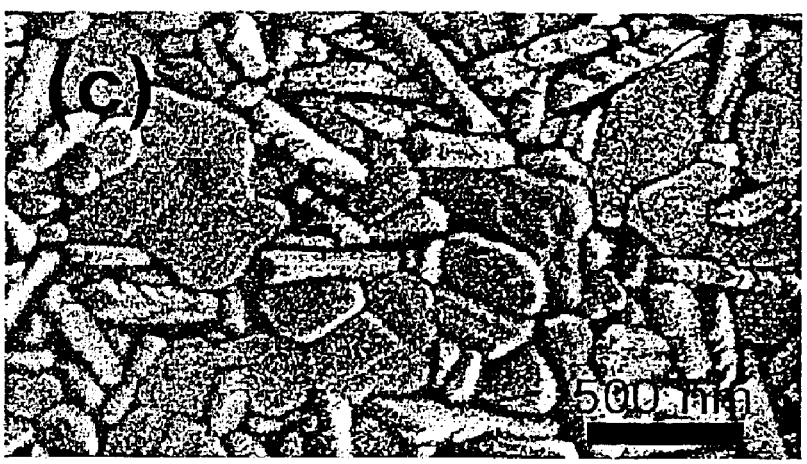

FIG. 3 is surface image of lanthanum substituted bismuth titanate ferroelectric film after thermal treatment at 700–950° C. As shown in FIG. 3, the ferroelectric film formed by means of chemical solution deposition is very smooth and has no cracks. The crystalline size of BLT ferroelectric film are increasing with the increasing temperature, besides, there are many plate-shaped grain having a size over 500 nm. This may relates to the preferred orientation of BLT at high temperature shown in the X-ray diffraction diagram of FIG. 4.

Figure 4:
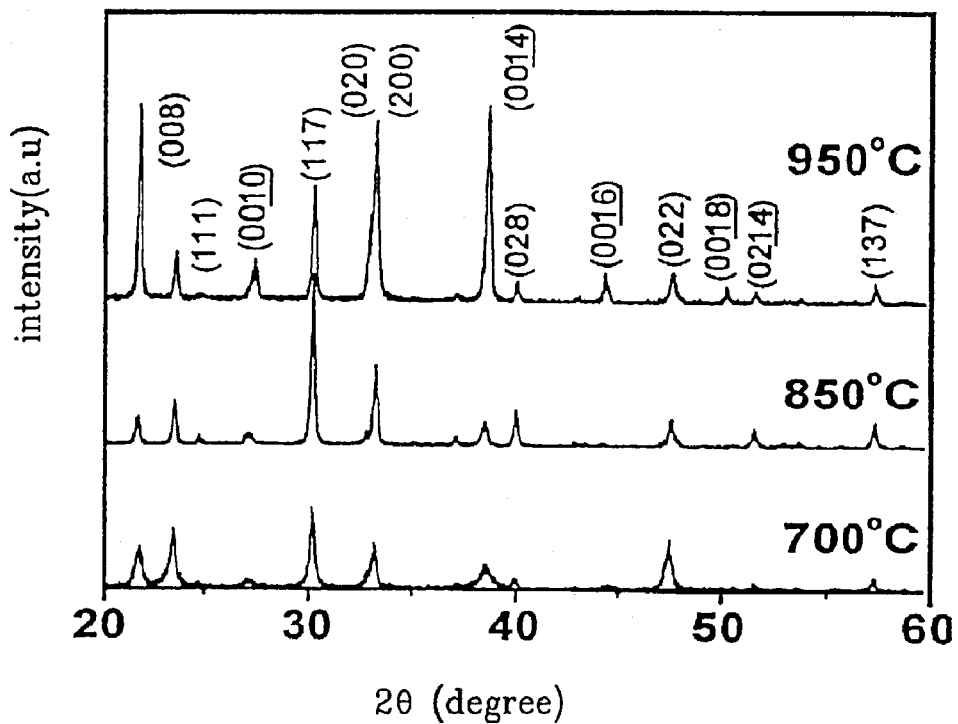
FIG. 4 is an X-ray diffraction diagram of lanthanum substituted bismuth titanate after thermal treatment at 700–950° C.

FIG. 4 is the X-ray diffraction diagram of the BLT ferroelectric film after thermal treatment at 700–950° C.

Comparing with the well-known SBT (SrBi$_2$Ta$_2$O$_9$) film, the temperature for forming the layered perovskite structure of the BLT film is lower about 150° C. The BLT film will form the layered perovskite structure at 700° C. rather than the second phase, and the strongest diffraction peak is (117). With the increasing temperature at 950° C., (008) and (0014) become the strongest diffraction peaks and still no second phase existed. Therefore, after thermal treatment at relatively high temperature, the BLT film has no changes in the structure and obviously has the preferred orientation at 950° C.

Figure 5:
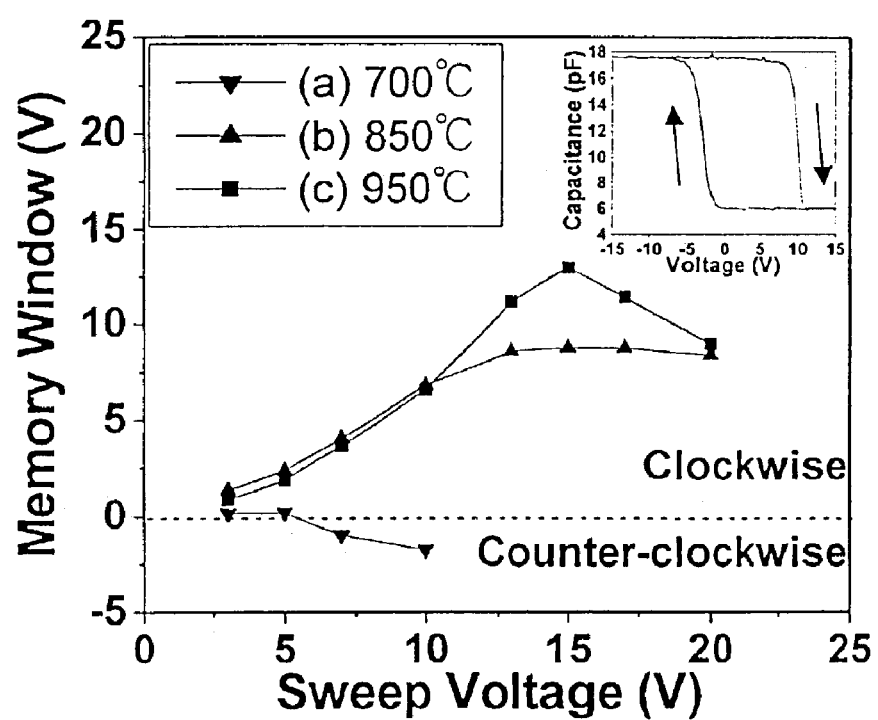
FIG. 5 is a diagram showing memory window value vs. added potential of lanthanum substituted bismuth titanate ceramics with ferroelectic film/aluminum oxide insulator/silicon substrate structure after thermal treatment at 700–950° C.

FIG. 5 is the diagram showing memory window value vs. external applied voltage of the MFIS capacitor with BLT/Al$_2$O$_3$/Si structure after thermal treatment at 700–950° C. As measuring the high frequency capacitance versus applied voltage for MFIS capacitor with p-type Si substrate, the obtained hysteresis curve in clockwise direction (the curve in the region up to the dotted line shown in FIG. 5) represents that the memory property results from the ferroelectric property of the ferroelectric film, and the opening of the memory window in the upper region of FIG. 5 is defined as positive. On the contrary, when the hysteresis curve presents the counterclockwise direction, that indicates that the memory property results from the charge-injection effect and the opening of the memory window in the region under the dotted line of FIG. 5 is defined as negative. According to FIG. 5, the memory window value of the ferroelectric effect is not good after thermal treatment the capacitor with BLT/Al$_2$O$_3$/Si structure at 700° C. When increasing applied voltage, the charge-injection effect still makes the hysteresis curve turn to negative. However, when the temperature of thermal treatment increases to 850° C., obviously, the memory window property results from ferroelectric effect. Even if the operating potential is over ±20 V, the memory window property is not of inferior quality, especially when the temperature of thermal treatment increases to 950° C., adding ±15 V can obtain the memory window property over 13 V. That is to say, when raising the temperature of thermal treatment, the obtained property of BLT/Al$_2$O$_3$/Si capacitor structure becomes more superior.

Figure 6:
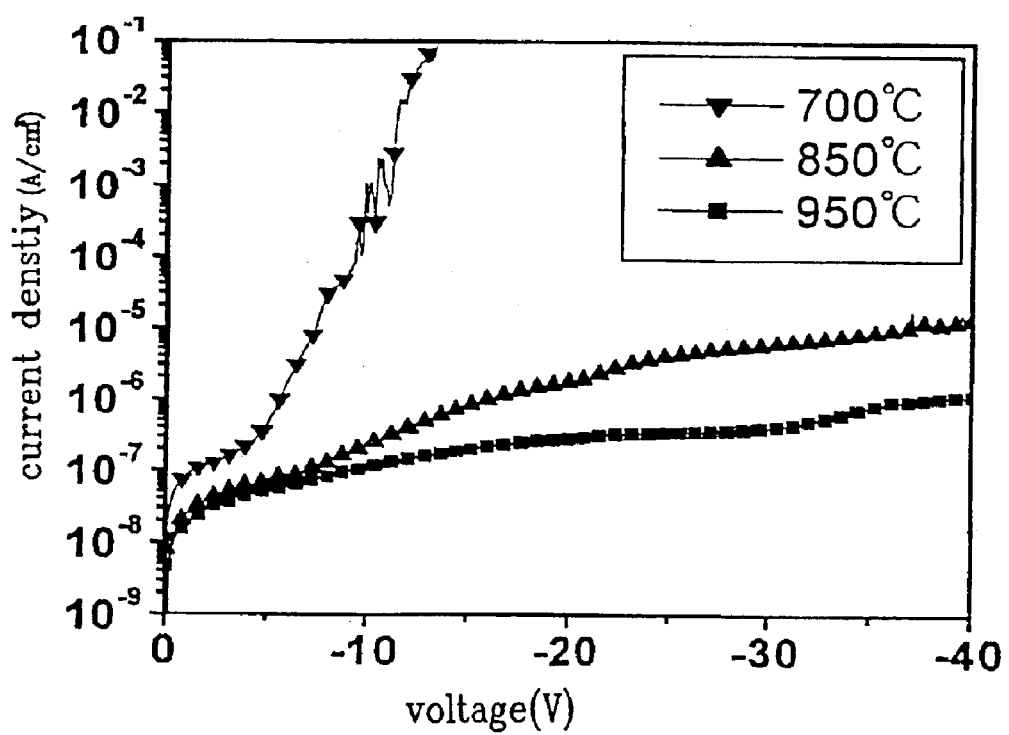
FIG. 6 is a diagram showing leakage current density vs. added voltage of lanthanum substituted bismuth titanate ceramics with ferroelectic film/aluminum oxide insulator/silicon substrate structure after thermal treatment at 700–950° C.

FIG. 6 is the leakage current density vs. added voltage diagram of MFIS capacitor with BLT/Al$_2$O$_3$/Si structure after thermal treatment at 700–950° C. According to FIG. 6, when the temperature of thermal treatment is 700° C., the leakage current density is 4.7×10$^{-7}$ A/cm$^2$ at potential of –100 kV/cm and similar to the leakage current density of vanadium-doped Bi$_4$Ti$_3$O$_{12}$, but the leakage current is still highest at relatively lower temperature among various annealing conditions. With increasing temperature, the curve of current density vs. applied voltage is gradually down, when the temperature is 950° C., the leakage current at –100 kV/cm is smaller than that at 700° C. by three grades of magnitude. Therefore, with increasing the temperature of thermal treatment, the leakage current density is much reduced and due to the reduction of the charge injection, the memory effect of ferroelectric property still maintains 8 V even when the added potential is ±20 V.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for manufacturing a semiconductor applied to a one-transistor ferroelectric memory device, comprising step of:

providing an aluminum oxide layer;

forming a bismuth ferroelectric film with bismuth layered perovskite structure on said aluminum oxide layer, wherein said bismuth is partially substituted by one of lanthanum and vanadium;

treating said aluminum oxide layer and said bismuth ferroelectric film at a high temperature; and depositing a metal upper electrode layer on said bismuth ferroelectric film.

2. The method according to claim 1, wherein said aluminum oxide layer is formed by means of sputtering.

3. The method according to claim 1, wherein said aluminum oxide layer is formed by means of metalorganic chemical vapor deposition (MOCVD).

4. The method according to claim 1, wherein said aluminum oxide layer is formed by means of electron beam evaporation and following oxidation process.

5. The method according to claim 1, wherein said bismuth ferroelectric film comprises bismuth ion precursors, titanium ion precursors and one of lanthanum ion precursors and vanadium ion precursors.

6. The method according to claim 5, wherein said bismuth ion precursors, titanium ion precursors and one selected from a group consisting of lanthanum ion precursors, vanadium ion precursors and the mixture thereof are at a molar ratio of (4–X):3:X (Bi$^{3+}$:Ti$^{4+}$:La$^{3+}$/V$^{3+}$), wherein 0<x<1.9.

7. The method according to claim 1, wherein said bismuth layered ferroelectric film is formed by means of spin coating of a chemical solution.

8. The method according to claim 7, wherein said chemical solution is one selected from a group consisting of bismuth acetate, lanthanum acetate, titanium n-butodixe and the mixture thereof dissolving in a mixing solvent of acetic acid and 2-methoxyethanol.

9. The method according to claim 7, wherein said chemical solution comprises a(n) metallo-organic precursor and an organic solvent.

10. The method according to claim 9, wherein said metallo-organic precursor is one selected from a group of bismuth, lanthanum and titanium with carbon chains, respectively.

11. The method according to claim 1, wherein said bismuth layered ferroelectric film is formed by means of sputtering.

12. The method according to claim 1, wherein said bismuth layered ferroelectric film is formed by means of pulsed laser deposition (PLD).

13. The method according to claim 1, wherein said bismuth layered ferroelectric film is formed by means of MOCVD.

14. The method according to claim 1, wherein said high temperature is ranged from 600 to 1000° C.

* * * * *